US009627818B1

(12) United States Patent
Chen et al.

(10) Patent No.: US 9,627,818 B1
(45) Date of Patent: Apr. 18, 2017

(54) ELECTRICAL CONNECTOR FIXED TO CIRCUIT BOARD

(71) Applicant: SPEED TECH CORP., Taoyuan (TW)

(72) Inventors: Li-Sen Chen, Taoyuan (TW); Cheng-Hsiang Hsueh, Taoyuan (TW); Chu-Cheng Wu, Taoyuan (TW)

(73) Assignee: SPEED TECH CORP., Taoyuan (TW)

( * ) Notice: Subject to any disclaimer, the term of this patent is extended or adjusted under 35 U.S.C. 154(b) by 0 days.

(21) Appl. No.: 15/098,323

(22) Filed: Apr. 14, 2016

(30) Foreign Application Priority Data

Nov. 12, 2015 (TW) ............................ 104218235 U

(51) Int. Cl.

| | |
|---|---|
| ***H01R 12/00*** | (2006.01) |
| ***H05K 1/00*** | (2006.01) |
| ***H01R 13/6587*** | (2011.01) |
| ***H01R 12/70*** | (2011.01) |
| ***H01R 13/50*** | (2006.01) |

(52) U.S. Cl.
CPC ....... *H01R 13/6587* (2013.01); *H01R 12/707* (2013.01); *H01R 13/50* (2013.01)

(58) Field of Classification Search
CPC ... H01R 13/6587; H01R 13/50; H01R 12/707
USPC ...................................................... 439/83, 79
See application file for complete search history.

(56) References Cited

U.S. PATENT DOCUMENTS

| | | | | |
|---|---|---|---|---|
| 8,465,302 | B2 | 6/2013 | Regnier et al. | |
| 2002/0137370 | A1 * | 9/2002 | Harting | H01R 12/57 439/83 |

* cited by examiner

*Primary Examiner* — Javaid Nasri
(74) *Attorney, Agent, or Firm* — CKC & Partners Co., Ltd.

(57) ABSTRACT

An electrical connector is fixed to a circuit board, and includes an inner insulating body and terminal modules. The inner insulating body includes a docking portion and a mounting portion. Each module has a carrier and terminals. The carrier is disposed on the mounting portion. The contacts are formed from a metal film and fixed to the carrier. Each terminal has a mating portion, a tail portion and a base portion connected between the mating portion and the tail portion. The mating portion extends from outside the carrier to inside the mating hole. The tail portion extends from outside the carrier to a surface of the circuit board. Each tail portion of a portion of the terminals has a soldering surface attached to the surface of the circuit board and a soldering pin passing through the surface of the circuit board respectively.

2 Claims, 10 Drawing Sheets

ELECTRICAL CONNECTOR FIXED TO CIRCUIT BOARD

RELATED APPLICATIONS

This application claims priority to Taiwanese Application Serial Number 104218235, filed Nov. 12, 2015, which is herein incorporated by reference.

BACKGROUND

Field of Invention

The present invention relates to an electrical connector. More particularly, the present invention relates to an electrical connector with an inner insulating body and terminals.

Description of Related Art

A typical connector of prior art, such as a connector of U.S. Pat. No. 8,465,302 as shown in the FIG. 1, is a connector fixed on a circuit board in an electrical device, and is a connector disposed and vertically stacked on the circuit board. In FIG. 1, the connector is a double-layer connector. That is, the connector may be regarded as a connector having two mating ports which are connected with two separate docking connectors (not shown). In the prior art, the connector includes an insulating shell A and four signal terminals B. Each of the signal terminals B has a mating portion B1, a connecting portion B2, and a tail portion B3. The mating portion B1 can mechanically contact the docking connector. The tail portion B3 is used for forming an electrical connection with the circuit board. The connecting portion B2 is connected between the mating portion B1 and the tail portion B3.

In FIG. 1, the tail portion B3 of each signal terminal B has a through hole B31, hereby enabling the tail portion B3 to have an elastic deformation capability. Once passing through the circuit board, the tail portion B3 of each signal terminal B will clamp the circuit board by its elastic restoring force, which is referred to as a press-fit terminal. Plural through holes have to be formed on the circuit board because the tail portion B3 of the press-fit terminal needs to pass through the circuit board, thereby enabling the tail portion B3 of each terminal B to clamp the circuit board. However, it is adverse to forming the through holes on the circuit board which transmits high frequency signals because a distance between adjacent through holes constrains another distance between adjacent terminals and the large number of the through holes increases the difficulty of layout on a circuit board, especially for the layout of multilayers on the circuit board. Moreover, because the connector using the press-fit terminal is not soldered on the circuit board and simpy relies on a retention force generated by the tail portion B3 of each terminal B clamping the circuit board, this type of connector is not suitable for use in an environment in which a user is allowed to plug in and out the connector several times.

The prior art provides an arrangement of tail portions B3 of the terminals B for resolving the aforementioned problem, but fails to resolve the problem effectively since such arrangement is still applied to the press-fit terminal.

SUMMARY

A primary object of the present disclosure is to provide an electrical connector formed from an inner insulating body and plural terminals, thereby enabling the connector to be fixed to a circuit board by soldering, thus reducing the number of through holes on the circuit board, further increasing the convenience of layout on the circuit board.

One of the embodiments in the disclosure herein provides an electrical connector. More particularly, the disclosure relates to an electrical connector with an inner insulating body and a plurality of terminals, such that the connector can reduce electrical crosstalk noises as transmitting signals.

A secondary object of the disclosure herein is to provide an electrical connector fixed to a circuit board. The electrical connector includes an inner insulating body and a plurality of terminal modules. The inner insulating body includes a docking portion and a mounting portion. The docking portion has at least one mating hole accommodating a portion of a docking connector. Each of the terminal modules has a carrier and a plurality of terminals. The carrier is disposed on the mounting portion. The terminals are formed from a metal film and fixed to the carrier. Each of the terminals has a mating portion, a tail portion and a base portion. The base portion is connected between the mating portion and the tail portion and positioned in the carrier. The mating portion extends from outside the carrier to inside the mating hole. The tail portion extends from outside the carrier to a surface of the circuit board. Each of the tail portions of a portion of the terminals has a soldering surface attached to the surface of the circuit board and a soldering pin passing through the surface of the circuit board.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
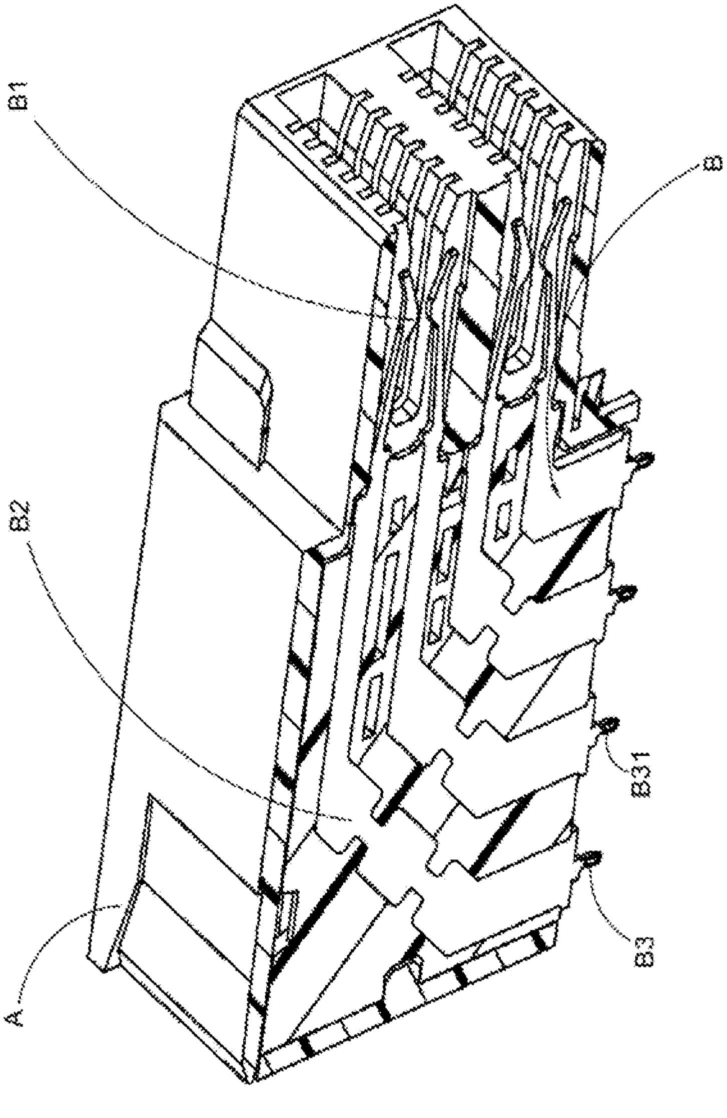
Fig. 1 (Prior Art)
FIG. 1 is a schematic perspective view of an electrical connector in accordance with the prior art of U.S. Pat. No. 8,465,302.
Figure 2:
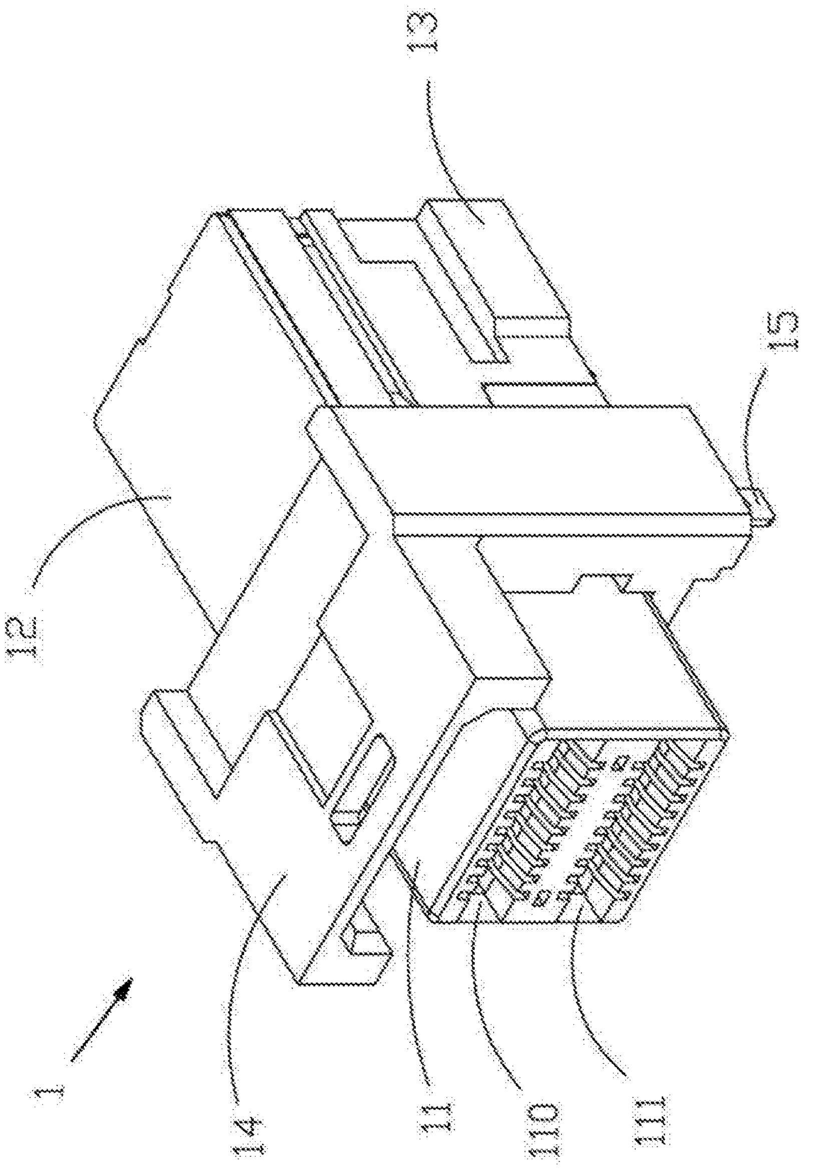
FIG. 2 is a schematic perspective view of an electrical connector in accordance with some embodiments of the present disclosure.
Figure 3:
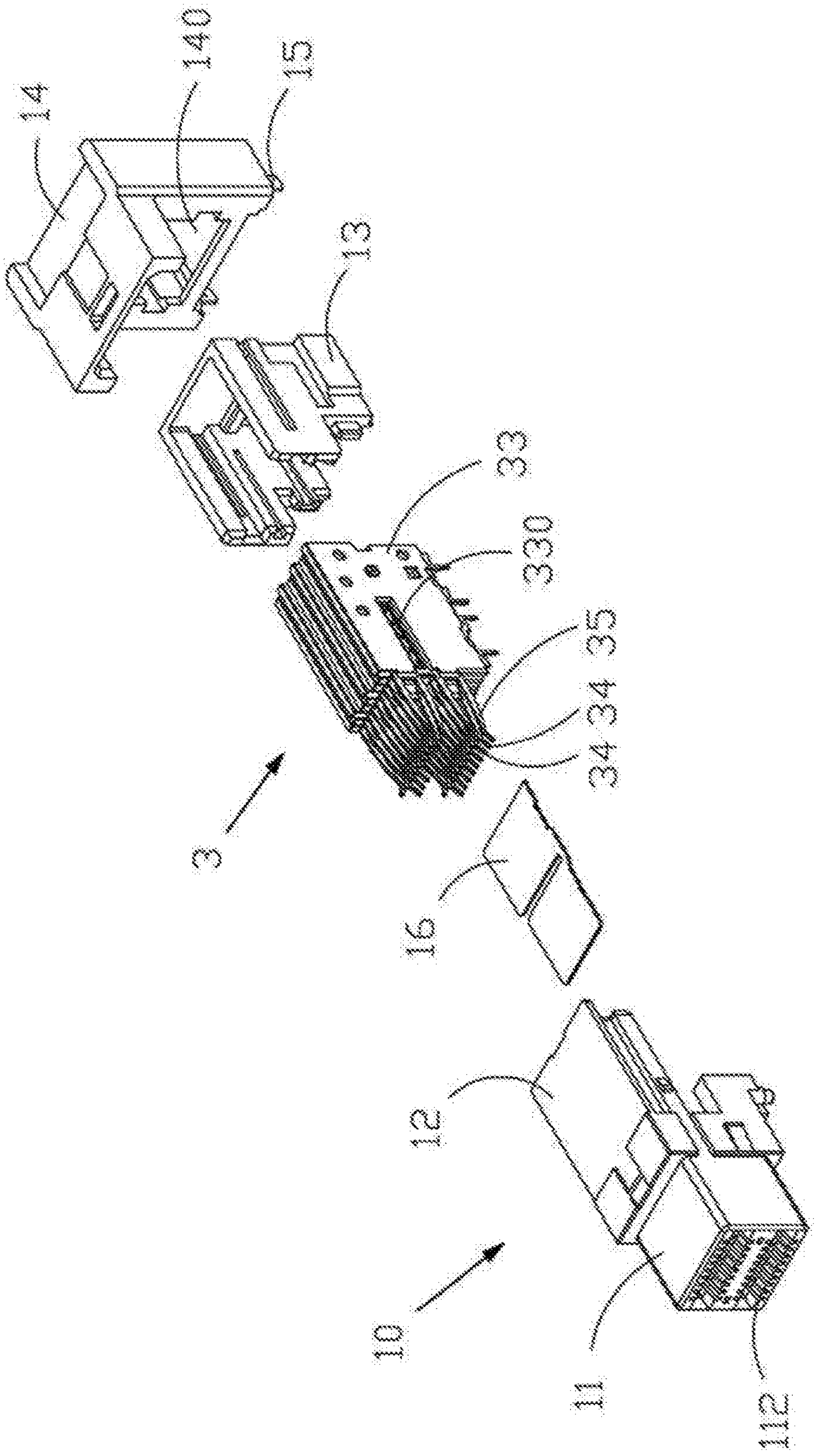
FIG. 3 is a schematic exploded view of an electrical connector in accordance with some embodiments of the present disclosure.
Figure 4:
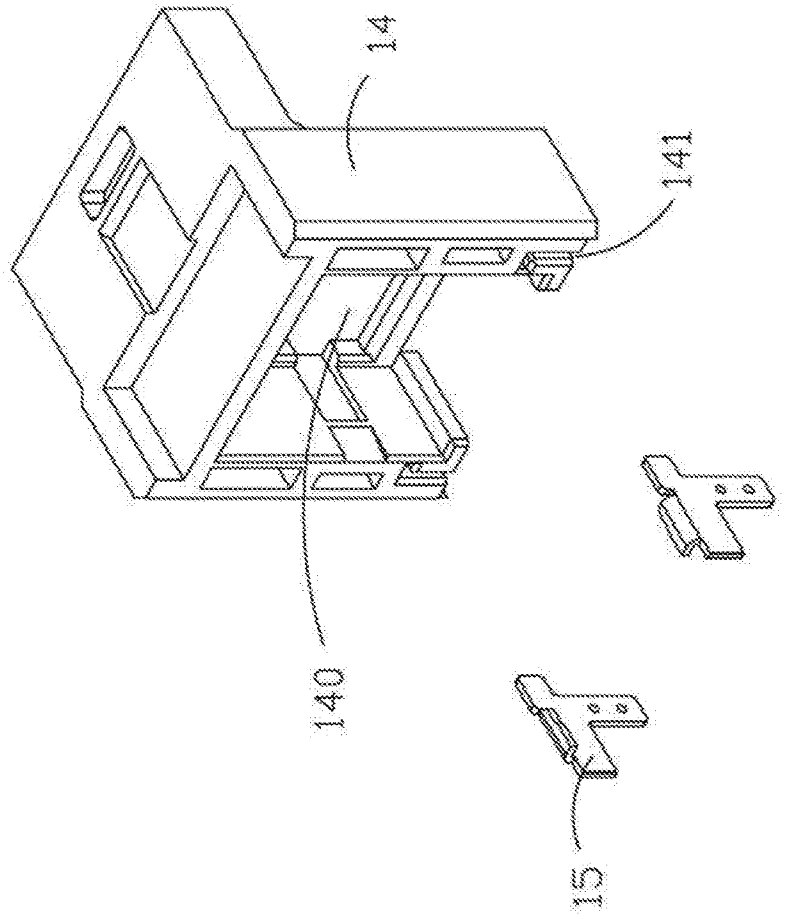
FIG. 4 is a schematic perspective view of a portion of an electrical connector in accordance with some embodiments of the present disclosure.
Figure 5:
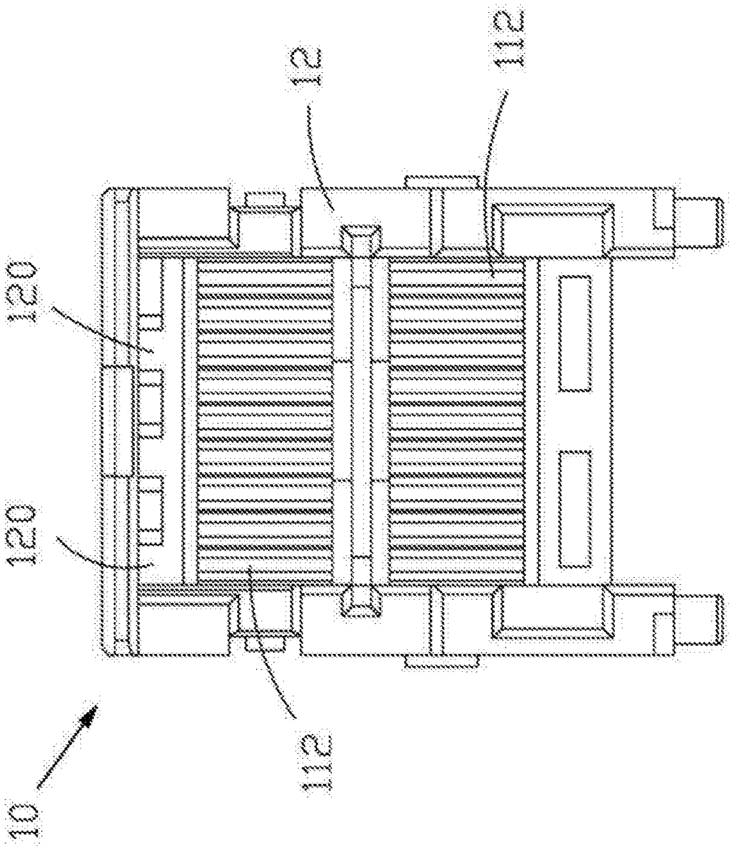
FIG. 5 is a schematic perspective view of a portion of an electrical connector in accordance with some embodiments of the present disclosure.
Figure 6:
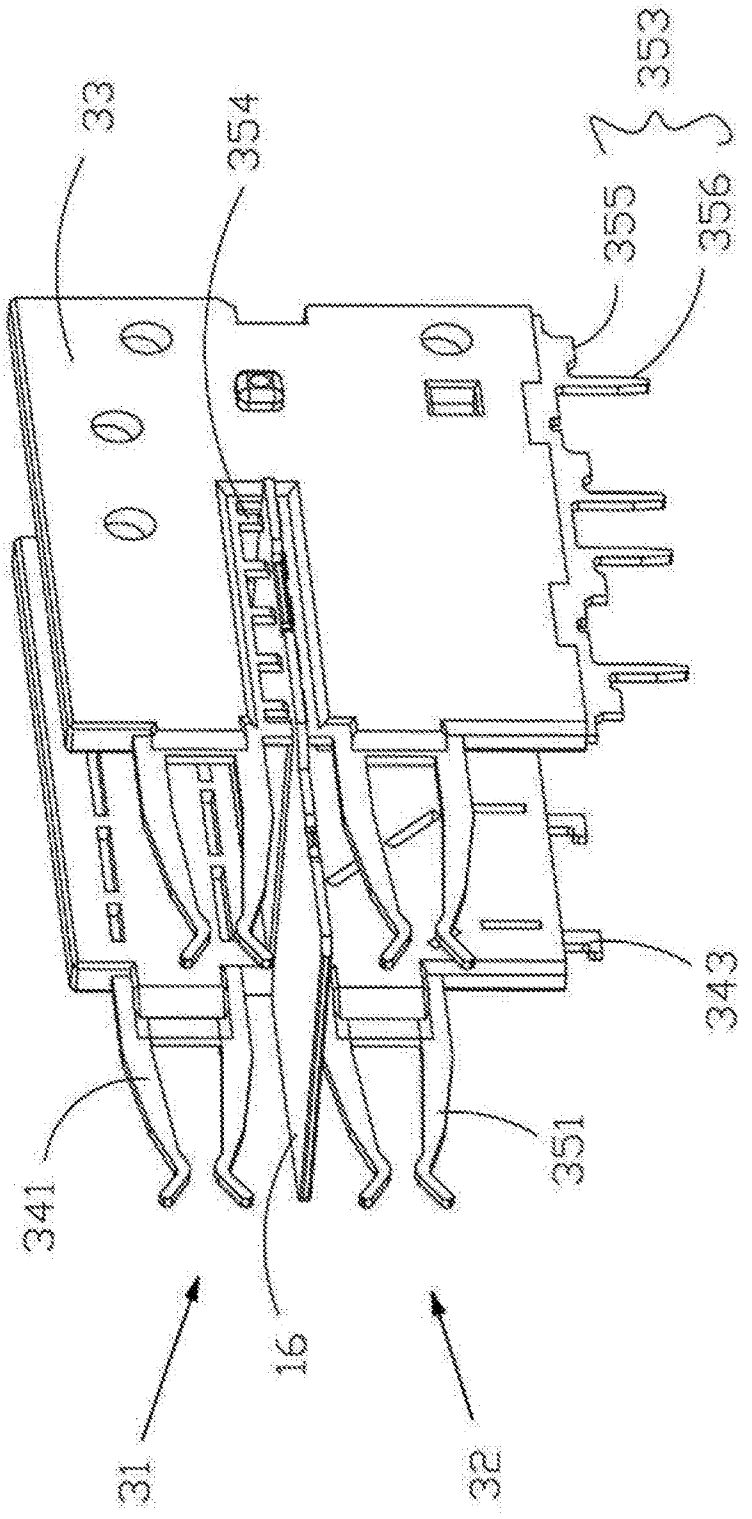
FIG. 6 is a schematic perspective view of a portion of an electrical connector in accordance with some embodiments of the present disclosure.
Figure 7:
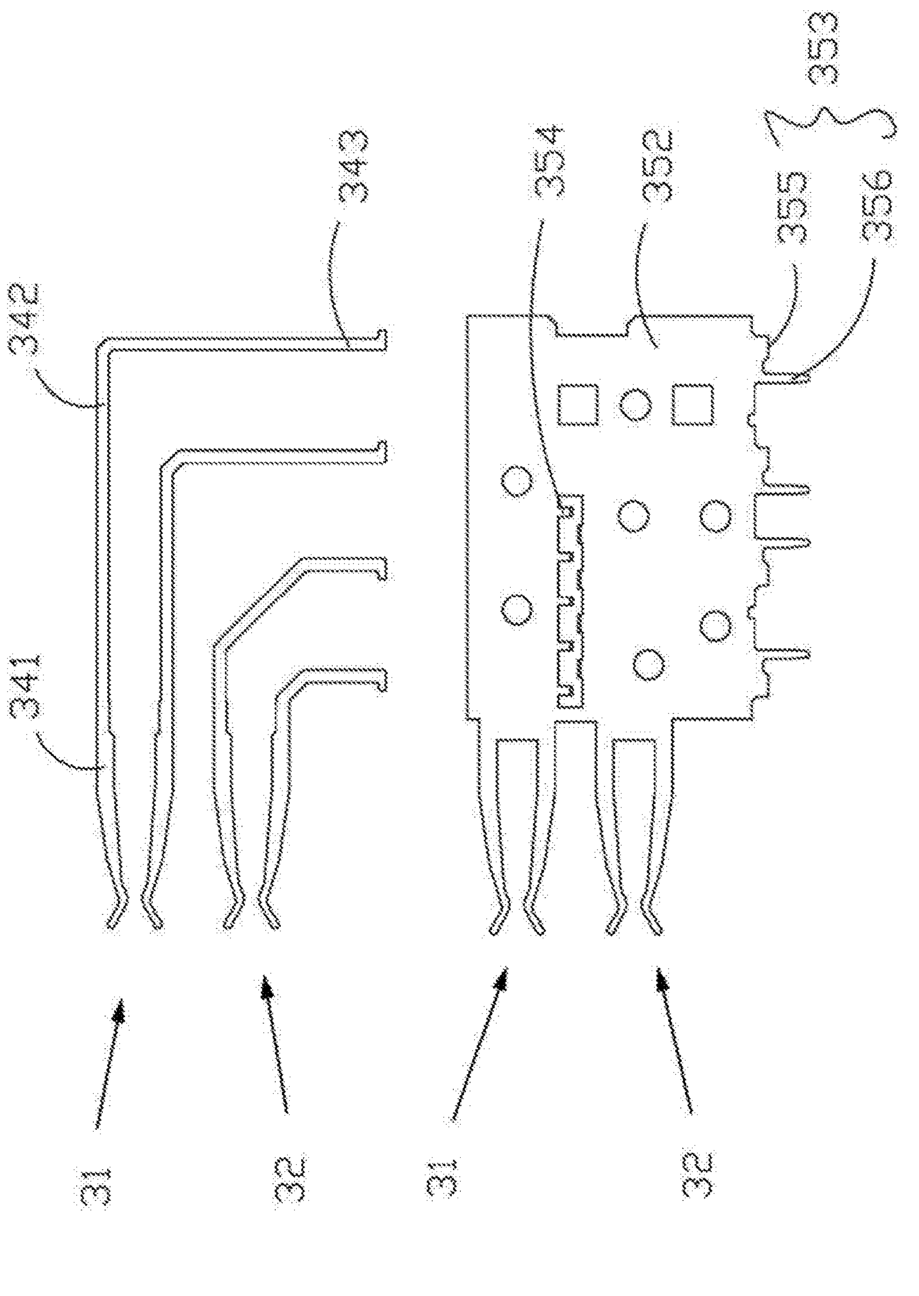
FIG. 7 is a schematic perspective view of a portion of an electrical connector in accordance with some embodiments of the present disclosure.

The following disclosures feature of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

FIGS. 2-10 are schematic views showing an electrical connector in accordance with some embodiments of the present disclosure. The electrical connector 1 is fixed to a circuit board 2. In some embodiments, the electrical connector 1 is a right angle electrical connector. The electrical connector 1 includes an inner insulating body 10, a rear cover 13, an outer insulating body 14, at least one positioning portion 15, a metal shielding plate 16, and terminal modules 3.

In some embodiments, the inner insulating body 10 includes a docking portion 11 and a mounting portion 12. The docking portion 11 extends from one side of the mounting portion 12. The docking portion 11 has an upper mating hole 110 and a lower mating hole 111 stacked on each other, such that the docking portion 11 can be connected with one or two docking connector (not shown). In some embodiments of a docking connector with two ports, the docking portion 11 has an upper mating hole 110 and a lower mating hole 111, such that the electrical connector can match with a docking connector having two ports, or match with two docking connectors each having one port. Those skilled in the art may apply the disclosure herein to an electrical connector with a single mating hole 110 or 111 in accordance with some embodiments of the present disclosure.

In some embodiments, the upper mating hole 110 and the lower mating hole 111 have corresponding terminal grooves 112 respectively. An inner surface of the mounting portion 12 has plural grooves 120, such that the terminal modules 3 are disposed on the mounting portion 12 and are corresponding to the grooves 120 respectively. And the rear cover 13 is disposed on the mounting portion 12 from opposite of the docking portion 11, and covers a part of the mounting portion 12 and the terminal modules 3.

In some embodiments, the outer insulating body 14 has an assembling hole 140, and has at least one recess 141 adjacent to the assembling hole 140. The inner insulating body 10 is embedded in the outer insulating body 14 through the assembling hole 140 and is monolithically formed with the outer insulating body 14 as one integral body. At least one positioning portion 15 is disposed in the recess 141. An end of the positioning portion 15 is fixed to the recess 141 in the outer insulating body 14, and another end of the positioning portion 15 is fixed to the circuit board 2. When the electrical connector 1 is fixed on the circuit board 2, the positioning portion 15 can be used for positioning the electrical connector 1, and increasing the holding force between the electrical connector 1 and the circuit board 2.

In some embodiments, the terminal module 3 has an upper contact pair 31, a lower contact pair 32 and a carrier 33. In some embodiments, the so called "upper contact pair31" and "lower contact pair32" refer to two corresponding signal terminals which are not arranged correspondingly in the upper mating hole 110 and/or the lower mating hole 111, and are not limited as a set of two corresponding signal terminals for transmitting a set of electrical signal. The carriers 33 are disposed in the corresponding grooves 120 respectively. The upper contact pair 31 and the lower contact pair 32 extend in the corresponding upper mating hole 110 and lower mating hole 111 respectively after the carriers 33 are mounted in the grooves 120, such that the upper contact pair 31 and the lower contact pair 32 can electrically connect the docking connector.

In some embodiments, the electrical connector may be electrically connected with a docking connector with two stacked ports. Hence, each carrier 33 has an upper contact pair 31 and a lower contact pair 32. However, each carrier 33 needs an upper contact pair 31 or a lower contact pair 32 when being applied to a docking connector with one single port. Those skilled in the art may readily use the present disclosure as a basis from the figure to modify the structures for implementing the embodiments introduced herein.

In some embodiments, the terminal module 3 includes a plurality of signal terminal modules 34 and plural ground terminals modules 35 arranged sequentially. The ground terminal modules 35 are arranged in both sides of the two adjacent signal terminal modules 34. The signal terminal modules 34 have signal terminals generally used for transmitting high frequency signals. The ground terminal module 35 are arranged in both side of the adjacent two signal terminal modules to form an order of a ground terminal module 35-*a* signal terminal module 34-*a* signal terminal module 34-*a* ground terminal module 35, thereby reducing electrical crosstalk noises when electrical signals are transmitted. Each terminal of the signal terminal module 34 has a mating portion 341, a tail portion 343 and a base portion 342 connected between the mating portion 341 and the tail portion 343. Each terminal of the ground terminal module 35 has a mating portion 351, a tail portion 353 and a base portion 352 connected between the mating portion 351 and the tail portion 353. The predetermined conditions used in the embodiments of the disclosure herein are in the upper mating hole 110 or the lower mating hole 111, adjacent signal terminals commonly transmit a set of differential electrical signals.

In some embodiments, the base portions 342 and 352 are positioned in the carrier 33, and mounted in the corresponding grooves 120 respectively by using the carriers 33. In some embodiments, the mating portions 341 of the upper contact pair 31 are the portions extending from outside the carrier 33 to the docking portion 11, and the mating portions 351 of the lower contact pair 32 are the portions extending from outside the carrier 33 to the docking portion 11, and the tail portions 343 of the upper contact pairs 31 are the portions extending from outside the carrier 33 to the circuit board 2, and the tail portions 353 of the lower contact pair 32 are the portions extending from outside the carrier 33 to the circuit board 2.

In some embodiments, the mating portions 341 and 351 extend in the corresponding terminal grooves 112 of the upper mating hole 110 and the lower mating hole 111 respectively. In some embodiments, the tail portion 343 is L shaped, and extends from outside the carrier 33 to the circuit board 2, and is soldered on a first soldering portion 21 of the circuit board 2. The tail portion 353 extends to the circuit board 2, and has a soldering surface 355 and a soldering pin 356. The soldering surface 355 is soldered on a second soldering portion 22 of the circuit board 2, and the soldering pin 356 passes through a through hole 220 of the second soldering portion 22, such that the ground terminal module 35 is electrically connected with the circuit board 2 through the soldering surface 355 and the soldering pin 356.

Figure 8:
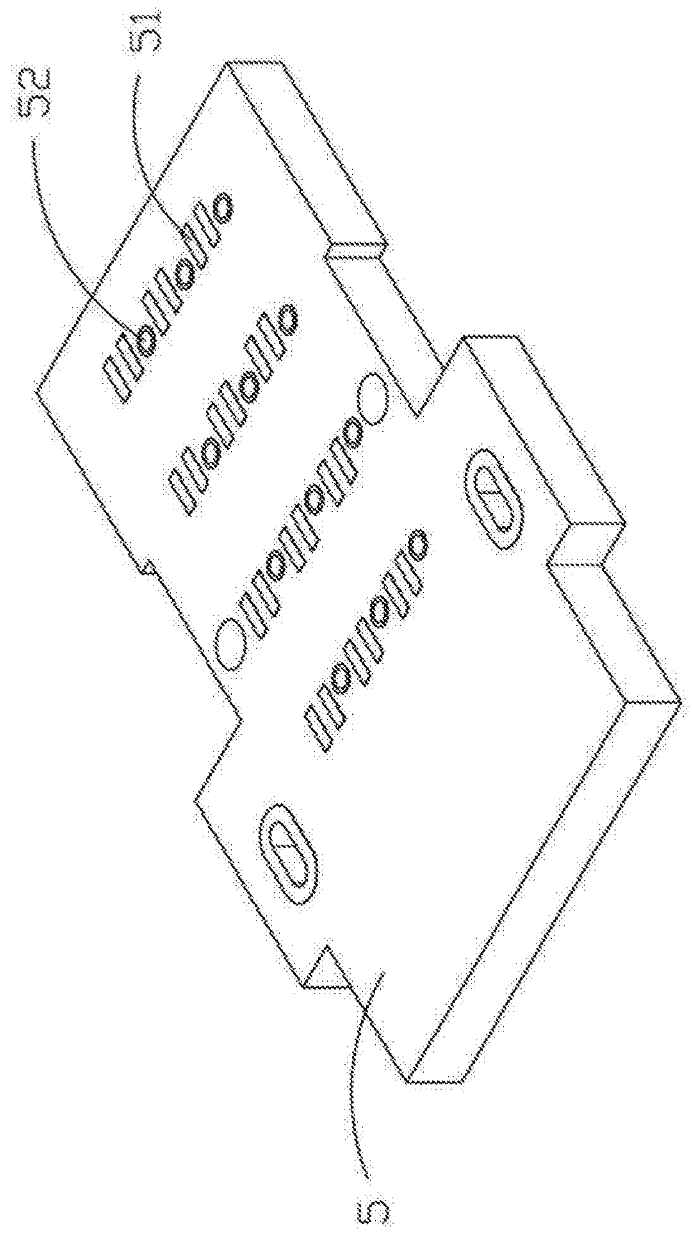
FIG. 8 is a schematic perspective view of a portion of an electrical connector in accordance with some embodiments of the present disclosure.

FIG. 8 is a schematic view of a circuit board 5 in accordance with some embodiments of the present disclosure. The circuit board 5 includes plural soldering portions 51 for soldering signal terminals and soldering portions 52 for soldering ground terminals. The layout of the soldering portions 51 and 52 are designed with tail portions of the signal terminals and the ground terminals (not shown). In FIG. 8, the soldering portion 52 is a through hole, and the adjacent soldering portion 51 is a stripe. In this layout, the distance between the soldering portion 52 and 51 is too small, and thus, when the soldering portion 52 and the tail portion of the ground terminal are in a soldering process, solder overflow is likely to occur thus causing the solder to contact the soldering portion 52 and 51 and resulting in a short circuit.

Figure 9:
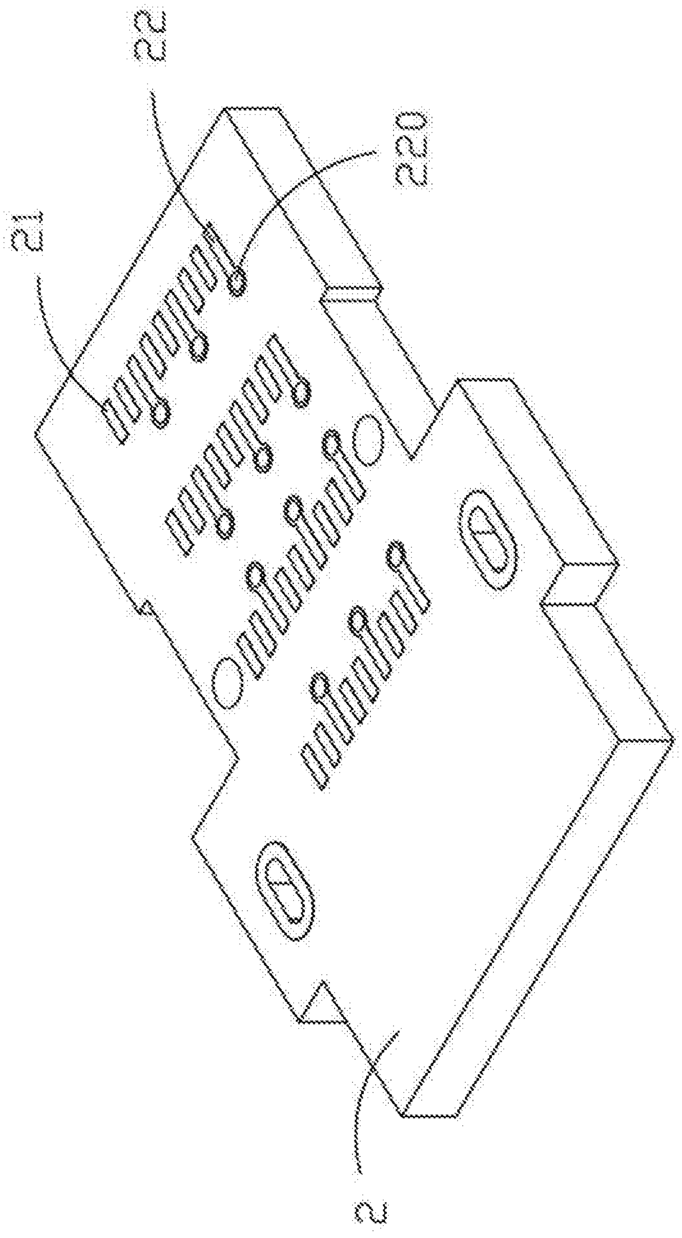
FIG. 9 is a schematic perspective view of a part of an electrical connector in accordance with some embodiments of the present disclosure.
Figure 10:
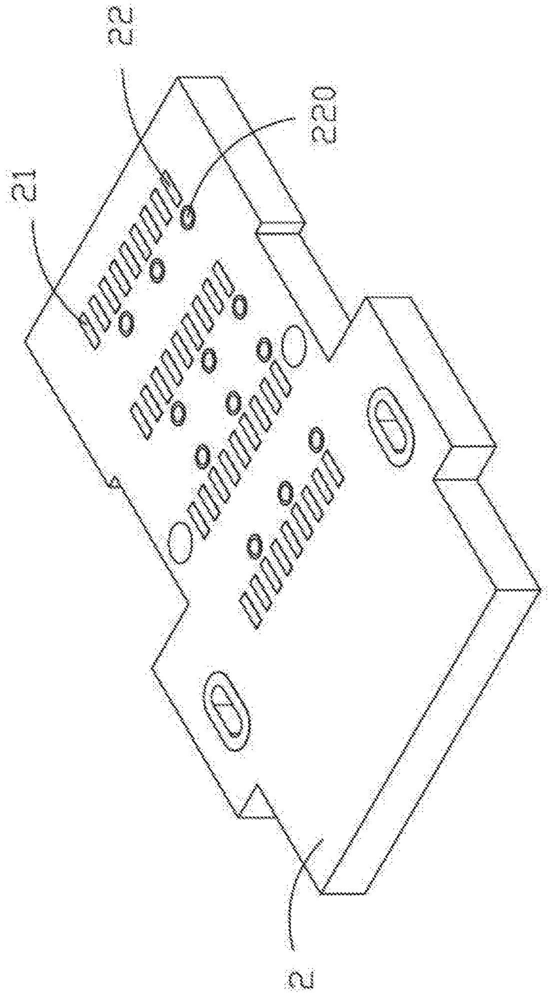
FIG. 10 is a schematic perspective view of a part of an electrical connector in accordance with some embodiments of the present disclosure.

FIG. 9 is a schematic view of a circuit board 2 in accordance with some embodiments of the present disclosure. The circuit board 2 includes plural first soldering portions 21, plural second soldering portions 22 and plural through holes 220, in which the through holes 220 are disposed on the corresponding second soldering portions 22 respectively. In FIG. 10, FIG. 10 is different from FIG. 9 in that the layout of the circuit board 2 keeps a distance between the through hole 220 and the second soldering portion 22. Regardless of which layout (in FIG. 9 or FIG. 10) is used, the circuit board can be soldered with the tail portion 353 and maintain an electrical contact with the tail portion 353.

In some embodiments, the tail portion 353 extends to the circuit board 2, and the soldering surface 355 of the tail portion 353 is soldered with the corresponding second soldering portion 22. The soldering pin 356 of the tail portion 353 passes though the corresponding through hole 220, thereby enabling the ground terminal module 35 to be electrical connected with the circuit board 2 through the soldering surface 355 and the soldering pin 356. In some embodiments, the first soldering portion 21 and the second soldering portion 22 are stripe-shaped and equidistantly arranged. The through holes 220 are disposed in the circuit board 2 and extend from the corresponding second soldering portions 22 respectively. In this layout, the distance between the through hole 220 and the first soldering portion 21 will increase, such that, when the second soldering portion 22 and the tail portion of the ground terminal are in a soldering process, solder overflow will be less likely to occur, thus reducing the probability of short circuiting.

In some embodiments, the carriers 33 of the signal terminal module 34 and the ground terminal module 35 have respective notches 330 communicating to each other. The notch 330 is disposed between the upper contact pair 31 and the lower contact pair 32 of the signal terminal module 34 and the ground terminal module 35. A metal shielding plate 16 is disposed in the notch 330. The carriers 33 are formed on the base portions 342 of the signal terminal module 34 and the base portions 352 of the ground terminal module 35 by injection molding. In some embodiments, the base portions 352 of the ground terminal modules 35 are plates used to isolate electrical crosstalk noises for the adjacent base portions 342 of the signal terminal modules 34 when signals are transmitted.

The base portion 352 of the ground terminal module 35 has a protrusion 354 which is from a material with mechanical rigidity. The protrusion 354 extends to the notch 330 and is electrically connected to the metal shielding plate 16. When the carriers 33 of the signal terminal module 34 and the ground terminal module 35 are mounted on the mounting portion 12, a portion of the metal shielding plate 16 pass through the inner insulating body 10 and is disposed between the upper contact pair 31 and the lower contact pair 32 of the signal terminal module 34 and the ground terminal module 35, thereby enabling the metal shielding plate 16 to isolate electrical crosstalk noises for the mating portions 341 of the upper contact pair 31 and the lower contact pair 32 of the signal terminal module 34 when signals are transmitted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrical connector fixed to a circuit board, the electrical connector comprising:

an inner insulating body comprising a docking portion and a mounting portion, the docking portion having at least one mating hole accommodating a portion of a docking connector; and a plurality of terminal modules, each of the terminal modules having a carrier and a plurality of terminals, wherein the carrier is disposed on the mounting portion, and the terminals are formed from a metal film and fixed to the carrier, wherein each of the terminals has a mating portion, a tail portion and a base portion which is connected between the mating portion and the tail portion and positioned in the carrier, and the mating portion extends from outside the carrier to inside the mating hole, and the tail portion extends from outside the carrier to a surface of the circuit board, and each of the tail portions of a portion of the terminals has a soldering surface attached to the surface of the circuit board and a soldering pin passing through the surface of the circuit board;

an outer insulating body having an assembling hole and at least one recess adjacent to the assembling hole, wherein the inner insulating body is embedded in the outer insulating body from the assembling hole, and matches with the outer insulating body as an integral body; and at least one positioning portion, wherein an end of the positioning portion is embedded in the recess, and the other end of the positioning portion is fixed to the circuit board.

2. The electrical connector of claim 1, wherein an inner surface of the mounting portion has a plurality of grooves, and the carriers are corresponding to the grooves respectively.

* * * * *